United States Patent
Nakayama et al.

(10) Patent No.: US 7,662,724 B2
(45) Date of Patent: Feb. 16, 2010

(54) METHOD OF MANUFACTURING A FERROELECTRIC CAPACITOR WITH A HYDROGEN BARRIER LAYER

(75) Inventors: Masao Nakayama, Chino (JP); Daisuke Kobayashi, Chino (JP)

(73) Assignee: Seiko Epson Corporation (JP)

( * ) Notice: Subject to any disclaimer, the term of this patent is extended or adjusted under 35 U.S.C. 154(b) by 439 days.

(21) Appl. No.: 11/456,371

(22) Filed: Jul. 10, 2006

(65) Prior Publication Data

US 2007/0010063 A1 Jan. 11, 2007

(30) Foreign Application Priority Data

Jul. 11, 2005 (JP) .............................. 2005-201796

(51) Int. Cl.
*H01L 21/302* (2006.01)

(52) U.S. Cl. .................. 438/738; 438/443; 438/689; 438/735; 257/532; 257/E21.017; 257/295

(58) Field of Classification Search .............. 438/3, 438/396, 738; 257/295, E21.017
See application file for complete search history.

(56) References Cited

U.S. PATENT DOCUMENTS 6,093,637 A * 7/2000 Kishimoto et al. .......... 438/624
6,440,815 B1 * 8/2002 Mitsuhashi ................. 438/396
6,455,882 B1 * 9/2002 Nakura ....................... 257/295
6,611,014 B1 * 8/2003 Kanaya et al. ............... 257/295
6,750,492 B2 6/2004 Mikawa et al.
7,060,552 B2 6/2006 Mikawa et al.
2002/0028584 A1* 3/2002 Oku et al. ................... 438/762
2004/0185635 A1 9/2004 Tatsunari
2004/0229384 A1 11/2004 Kijima et al.

FOREIGN PATENT DOCUMENTS

| JP | 07-273297 | 10/1995 |
|---|---|---|
| JP | 2003-068987 | 3/2003 |
| JP | 2003-243625 | 8/2003 |
| JP | 2004-281956 | 10/2004 |
| JP | 2004-311924 | 11/2004 |

* cited by examiner

*Primary Examiner*—Thao X Le
*Assistant Examiner*—Ajay K Arora
(74) *Attorney, Agent, or Firm*—Harness, Dickey & Pierce, P.L.C.

(57) ABSTRACT

A method for manufacturing a capacitor includes the steps of: forming a lower electrode above a base substrate; forming a dielectric film composed of ferroelectric material or piezoelectric material above the lower electrode; forming an upper electrode above the dielectric film; forming a silicon oxide film that covers at least the dielectric film and the upper electrode; and forming a hydrogen barrier film that covers the silicon oxide film.

11 Claims, 3 Drawing Sheets

METHOD OF MANUFACTURING A FERROELECTRIC CAPACITOR WITH A HYDROGEN BARRIER LAYER

The entire disclosure of Japanese Patent Application No. 2005-201796, filed Jul. 11, 2005 is expressly incorporated by reference herein.

BACKGROUND

1. Technical Field

The present invention relates to methods for manufacturing capacitors.

2. Related Art

In recent years, ferroelectric memories (FeRAMs) are expected as one of next generation type memories. Ferroelectric memories are characterized by nonvolatility, high-speed operation and low-power consumption.

In ferroelectric memory devices the crystal state of ferroelectric films composed of ferroelectric material defines one of the factors that determine the characteristics of the devices. A process for manufacturing ferroelectric memories includes the steps of forming interlayer dielectric films and protection films, and a large amount of hydrogen is usually generated in these steps. In this instance, because ferroelectric films are formed from oxide, the oxide is reduced by hydrogen generated during the manufacturing process, which undesirably affects the characteristics of the ferroelectric memories.

For this reason, in an ordinary ferroelectric memory having a capacitor, a ferroelectric film may be covered by a hydrogen barrier film such as an aluminum oxide film in order to prevent deterioration of the characteristics of the ferroelectric film, thereby securing the reduction-resistance of the capacitor, Japanese laid-open patent application JP-A-2003-243625 is an example of related art.

SUMMARY

A method for manufacturing a capacitor, in accordance with an advantage of some aspects of the present invention, can improve the productivity.

In accordance with an embodiment of the invention, a method for manufacturing a capacitor includes the steps of: forming a lower electrode above a base substrate; forming a dielectric film composed of ferroelectric material or piezoelectric material above the lower electrode; forming an upper electrode above the dielectric film; forming a silicon oxide film that covers at least the dielectric film and the upper electrode; and forming a hydrogen barrier film that covers the silicon oxide film.

According to the method for manufacturing a capacitor, because at least the dielectric film and the upper electrode are covered by the silicon oxide film, the hydrogen barrier film can be made thinner while securing a desired hydrogen barrier property thereof. By this, the productivity can be improved and the manufacturing cost can be reduced.

In the description concerning the present invention, the word "above" may be used in, for example, "forming a specific object (hereafter referred to as "B") 'above' another specific object (hereafter referred to as "A")." In the description concerning the present invention, in such an exemplary case, the word "above" is used assuming that it includes a case in which B is formed directly on A, and a case in which B is formed over A through another object.

In the method for manufacturing a capacitor in accordance with an aspect of the embodiment, the silicon oxide film may be formed with trimethoxysilane.

In the method for manufacturing a capacitor in accordance with an aspect of the embodiment, the hydrogen barrier film may be composed of aluminum oxide.

In the method for manufacturing a capacitor in accordance with an aspect of the embodiment, the silicon oxide film may be formed by a dual-frequency excitation plasma CVD method.

The method for manufacturing a capacitor in accordance with an aspect of the embodiment may include the step of etching back the silicon oxide film before the step of forming the hydrogen barrier film.

The method for manufacturing a capacitor in accordance with an aspect of the embodiment may include the steps of forming a contact hole penetrating the hydrogen barrier film and the silicon oxide film, and forming a wiring layer that embeds the contact hole, wherein an etching selection ratio of the silicon oxide film to the upper electrode may be greater than an etching selection ratio of the hydrogen barrier film to the upper electrode.

The method for manufacturing a capacitor in accordance with an aspect of the embodiment may include the step of forming another silicon oxide film above the hydrogen barrier film.

In the method for manufacturing a capacitor in accordance with an aspect of the embodiment, a film forming temperature for forming the other silicon oxide film may be higher than a film forming temperature for forming the silicon oxide film.

A capacitor in accordance with an embodiment of the invention includes: a lower electrode formed above a base substrate; a dielectric film composed of ferroelectric material or piezoelectric material formed above the lower electrode; an upper electrode formed above the dielectric film; a silicon oxide film that covers at least the dielectric film and the upper electrode; and a hydrogen barrier film that covers the silicon oxide film.

DESCRIPTION OF EXEMPLARY EMBODIMENTS

Preferred embodiments of the invention are described below with reference to the accompanying drawings.

Figure 1:
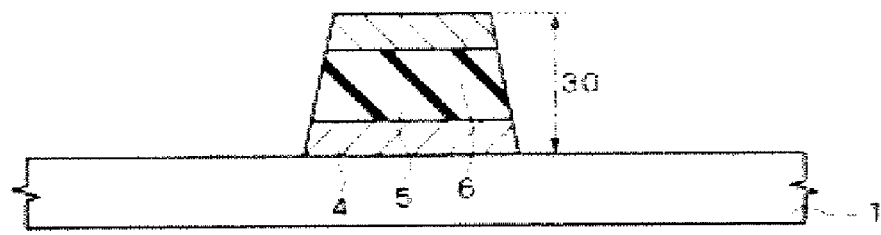
FIG. 1 is a cross-sectional view schematically showing a step of a process for manufacturing a capacitor in accordance with an embodiment of the invention.

A method for manufacturing a capacitor in accordance with an embodiment of the invention and a capacitor obtained by the manufacturing method are described with reference to FIG. 1, FIG. 2 and FIG. 4-FIG. 8. FIG. 1, FIG. 2 and FIG. 4-FIG. 8 are cross-sectional views schematically showing a process for manufacturing a capacitor in accordance with the present embodiment First, layers for forming a lower electrode 4, a dielectric film 5 and an upper electrode 5 are sequentially deposited on a base substrate 1. Next, as shown in FIG. 1, the layers for forming the lower electrode 4, the dielectric film 5 and the upper electrode 6 are etched into a desired configuration. As a result, a columnar deposited body (hereafter referred to as a "columnar section") 30 composed of the lower electrode 4, the dielectric film 5 and the upper electrode 6 is formed on the base substrate 1. The columnar section 30 can function as a capacitor. The capacitor may be in a stacked type shown in FIG. 1, or in a planar type. The capacitor may be used as, for example, a ferroelectric capacitor with the ferroelectric film 5 that is composed of a ferroelectric material. The ferroelectric capacitor can be applied to a ferroelectric memory. As the ferroelectric memory, a variety of cell systems such as 1T1C type, cross-point type or the like can be used.

As the base substrate 1, for example, a semiconductor substrate, a resin substrate or the like can be optionally used depending on its usage without any particular limitation. As the lower electrode 4 and the upper electrode 6, for example, a high melting point metal such as Pt or Ir, or an oxide of the aforementioned metal can be used. The lower electrode 4 and the upper electrode 6 can be formed by, for example, a sputter method, a vapor deposition method or the like. As the lower electrode 4 and the upper electrode 6, materials that are difficult to react with the ferroelectric film 5, and allow excellent formation of the ferroelectric film 5 may desirably be used. Concretely, for example, as the lower electrode 4 and the upper electrode 6, Pt may be used. As the ferroelectric film 5, a ferroelectric film in which Nb is doped in lead zirconate titanate that includes Pb, Zr and Ti as constituent elements (hereafter referred to as "PZTN") can be used. The dielectric film 5 may be formed by a method that includes coating a sol-gel solution containing Pb, Zr, Ti and Ni by, for example, a spin coat method, on the lower electrode 4. The film thickness of the lower electrode 4 may be, for example, 200 nm, the film thickness of the ferroelectric film 5 may be, for example, 150 nm, and the film thickness of the upper electrode 6 may be, for example, 200 nm.

Figure 2:
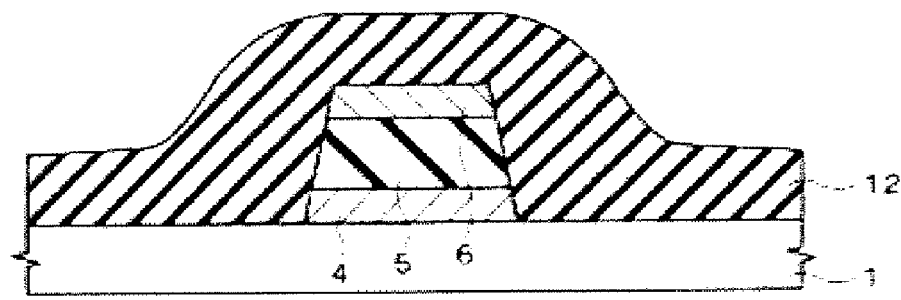
FIG. 2 is a cross-sectional view schematically showing a step of the process for manufacturing a capacitor in accordance with the embodiment of the invention.

Next, as shown in FIG. 2, a silicon oxide ($SiO_2$) film (hereafter referred to as a "first silicon oxide film") 12 that covers the lower electrode 4, the ferroelectric film 5 and the upper electrode 6, in other words, the columnar section 30, is formed. By this, the surface on which a hydrogen barrier film 14 is to be formed in a step to be described below can have a gentler curve.

Figure 3:
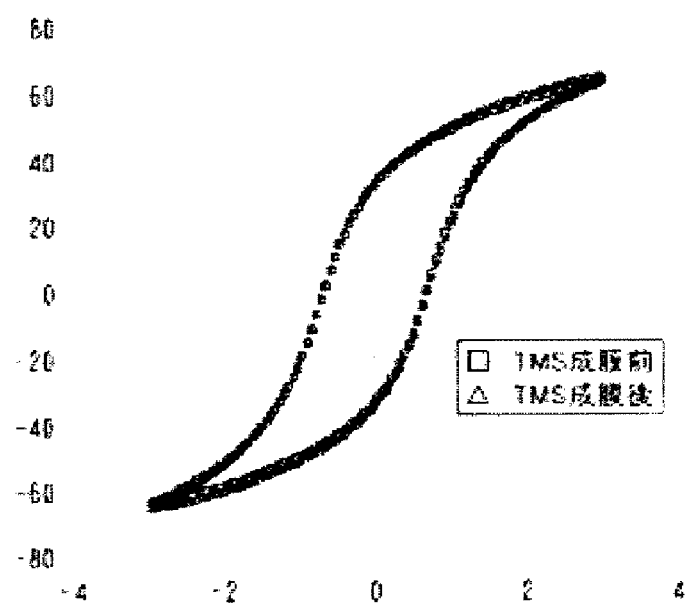
FIG. 3 shows hysteresis characteristics before and after formation of a first silicon oxide film in accordance with the embodiment of the invention.

The first silicon oxide film 12 may be formed by, for example, a chemical vapor deposition (CVD) method with trimethoxysilane (TMS). The first silicon oxide film 12 may be formed to a film thickness of, for example, 600 nm. As the CVD method, a dual-frequency excitation plasma CVD method in which RFs (radio frequencies) are impressed to both of the plasma source side and the bias side is particularly preferred. By this, deterioration of the hysteresis characteristics of the dielectric film 5 can be prevented. FIG. 3 shows measurement results of the hysteresis characteristics of the dielectric film 5 before and after the first silicon oxide film 12 was formed with TMS. As shown in FIG. 3, before and after the film was formed with TMS, the hysteresis characteristics of the dielectric film 5 did not change, and therefore it is understood that the characteristics were not deteriorated. It is noted that, as the experimental conditions in this case, $N_2O$ was used as an oxidizing agent, the power at the plasma source side was set to 300 W, and the power on the bias side was set to 300 W.

The number of carbon atoms (C) and the number of hydrogen atoms (H) per one molecule of trimethoxysilane (TMS: $(CH_3O)_3SiH$) are about half of those of tetraethoxysilane (TEOS:$(C_2H_5O)_4Si$) that is generally used for forming a silicon oxide film, respectively. Therefore, by using TMS, generation of hydrogen can be suppressed during the CVD process, and TMS would more likely be decomposed than TEOS, such that the first silicon oxide film 12 with excellent quality can be obtained at low temperatures (room temperature—350° C.). In other words, the process for forming the first silicon oxide film 12 with TMS can be conducted with a smaller amount of hydrogen and at lower temperatures, compared to the forming process with TEOS (at a forming temperature of 400° C. and higher), such that hydrogen can be prevented from diffusing in the dielectric film 5. According, by using TMS, process damages on the dielectric film 5 due to the reduction action can be reduced such that the first silicon oxide film 12 with excellent quality can be obtained. In particular, when PZTN is used as the dielectric film 5, and the first silicon oxide film 12 is formed with TMS, almost no damage is caused in the dielectric film 5.

Next, a heat treatment may be conducted if necessary. By this, the electrical characteristics can be improved. As the conditions for the heat treatment, for example, the heat treatment may be conducted at 600° C. for 5 minutes.

Figure 4:
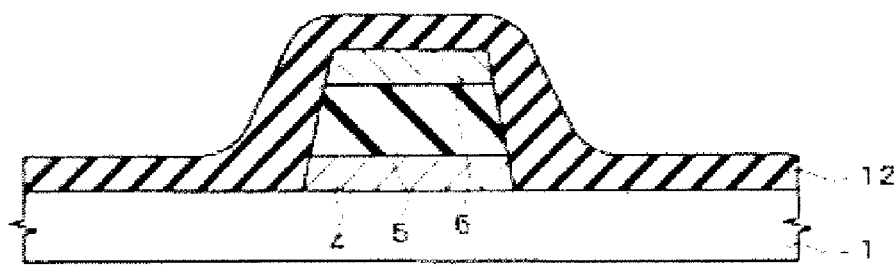
FIG. 4 is a cross-sectional view schematically showing a step of the process for manufacturing a capacitor in accordance with the embodiment of the invention.

Next, as shown in FIG. 4, the first silicon oxide film 12 may be etched back. By this, the surface of the first silicon oxide film 12 becomes gentler, such that a hydrogen barrier film 14 that is formed in the following step can be formed with better coverage. The film thickness of the first silicon oxide film 12 after the film has been etched back may be, for example, 400 nm. The etch back step may be conducted by, for example, RIE (reactive ion etching) with a mixed gas of $CHF_3$ and $O_2$.

Figure 5:
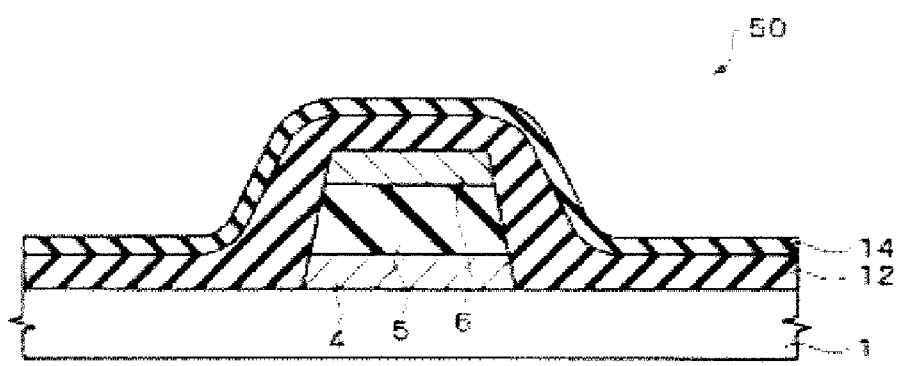
FIG. 5 is a cross-sectional view schematically showing a step of the process for manufacturing a capacitor in accordance with the embodiment of the invention.

Next, as shown in FIG. 5, a hydrogen barrier layer 14 that covers the first silicon oxide film 12 is formed. As the hydrogen barrier film 14, for example, a film of aluminum oxide ($Al_2O_3$), titanium oxide or the like can be used. The hydrogen barrier film 14 may be formed by a sputter method.

The surface on which the hydrogen barrier film 14 is formed is gentler compared to the case where the columnar section 30 is not covered by the first silicon oxide film 12. Accordingly, in accordance with the present embodiment, the hydrogen barrier film 14 can be formed with excellent coverage on the gently curved first silicon oxide film 12. As a result, even when the hydrogen barrier film 14 is made thinner, a desired hydrogen barrier property can be secured. For example, when a film of aluminum oxide is used as the hydrogen barrier film 14, a desired hydrogen barrier property can be secured even when the film thickness of the hydrogen barrier film 14 is about 20 nm. In contrast, for example, when the columnar section 30 is not covered by the first silicon oxide film 12, it is difficult to form a uniform film of aluminum oxide that covers the columnar section 30. Therefore, in this case, the hydrogen barrier film 14 may need to have a film thickness of for example, about 60 nm in order to secure a desired hydrogen barrier property. Accordingly, for example, when a layer of aluminum oxide is used as the hydrogen barrier film 14, the film thickness of the hydrogen barrier film 14 can be reduced to about one third (⅓) when the columnar section 30 is covered by the first silicon oxide film 12, compared to the case where the columnar section 30 is not covered by the first silicon oxide film 12.

By the steps described above, a first capacitor 50 in accordance with the present embodiment can be formed, as shown in FIG. 5.

Figure 6:
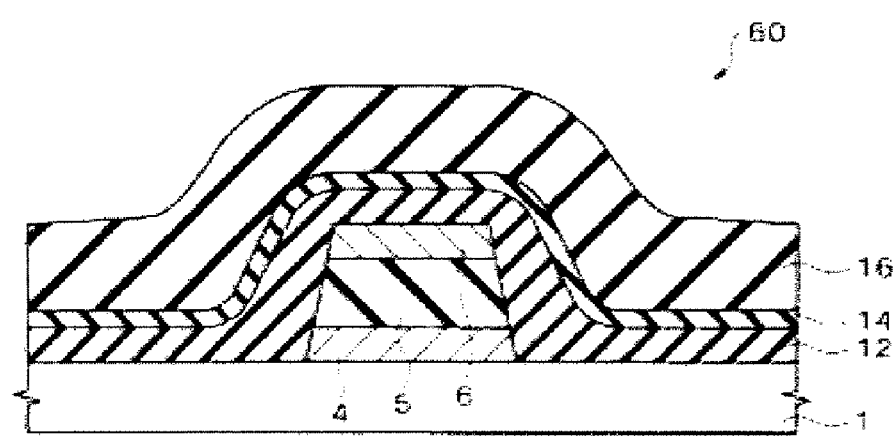
FIG. 6 is a cross-sectional view schematically showing a step of the process for manufacturing a capacitor in accordance with the embodiment of the invention.

Next, as shown in FIG. 6, another silicon oxide film (hereafter referred to as a "second silicon oxide film") 16 may be formed on the hydrogen barrier film 14. The second silicon oxide film 16 may have a film thickness of, for example, about 400 nm. The second silicon oxide film 16 may be formed by, for example, a CVD method using TMS.

When the second silicon oxide film 16 is formed any one of a variety of materials (for example, TEOS) that can be used for forming a silicon oxide film may be used without consideration of generation of hydrogen during the process as the hydrogen barrier film 14 has already been formed. Further, as the hydrogen barrier film 14 has been formed, process damages to the dielectric film 5 can be suppressed even when the film forming temperature for forming the second silicon oxide film 16 is high. In other words, without consideration of process damages to the dielectric film 5, the film forming temperature of the second silicon oxide film 16 can be set, and therefore the second silicon oxide film 16 with excellent quality can be formed.

It is noted that, depending on the necessity, the second silicon oxide film 16 may not be formed.

By the steps described above, a second capacitor 60 in accordance with an embodiment of the invention can be formed, as shown in FIG. 6.

Figure 7:
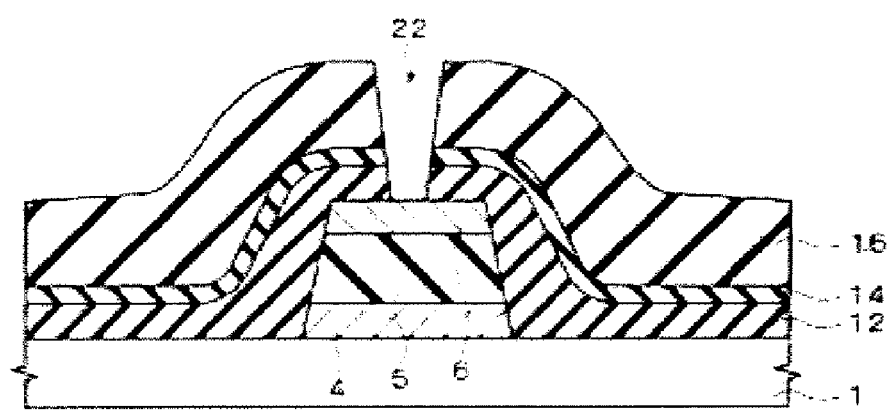
FIG. 7 is a cross-sectional view schematically showing a step of the process for manufacturing a capacitor in accordance with the embodiment of the invention.

Next, as shown in FIG. 7, a contact hole 22 that penetrates the second silicon oxide film 16, the hydrogen barrier film 14 and the first silicon oxide film 12 is formed above the upper electrode 6. The contact hole 22 may be formed by etching the second silicon oxide film 16, the hydrogen barrier film 14 and the first silicon oxide film 12. Concretely, the contact hole 12 may be formed in the following manner.

First, the second silicon oxide film 16 is etched in a desired region. The second silicon oxide film 16 may be etched by, for example, RIE with a mixed gas of $CHF_3$ and $O_2$.

Next, a desired region of the hydrogen barrier film 14 is etched. It is noted that the first silicon oxide film 12 is formed between the hydrogen barrier film 14 and the upper electrode 6. For this reason, even when the hydrogen barrier film 14 is over-etched, the upper electrode 6 can be prevented from being etched. The hydrogen barrier film 14 may be etched by, for example, high density plasma etching with a mixed gas of $BCl_3$ and $Cl_2$. By this, a greater etching rate can be achieved, compared, for example, to the case where etching is conducted by RIE with a mixed gas of $CHF_3$ and $O_2$, like etching of the first silicon oxide film 12 to be described below. For example, when the hydrogen barrier film 14 is composed of aluminum oxide, and the hydrogen barrier film 14 is etched by RIE with a mixed gas of $CHF_3$ and $O_2$, the etching rate is about 10 nm/min. On the other hand, when the hydrogen barrier film 14 is etched by high density plasma etching with a mixed gas of $BCl_3$ and $Cl_2$, the etching rate is about 100 nm/min.

Next, a desired region of the first silicon oxide film 12 is etched. In accordance with the present embodiment, the etching selection ratio of the first silicon oxide film 12 to the upper electrode 6 (=the etching rate of the first silicon oxide film 12/the etching rate of the upper electrode 6) may be greater than the etching selection ratio of the hydrogen barrier film 14 to the upper electrode 6 (=the etching rate of the hydrogen barrier film 14/the etching rate of the upper electrode 6). By this, the upper electrode 6 may be prevented from being over etched. In other words, for example, it would become more difficult to etch the upper electrode 6 according to the present embodiment, compared to the case where the hydrogen barrier film 14 is formed directly on the upper electrode 6. Accordingly, the material composing the upper electrode 6 (such as, for example, Pt or other nonvolatile metal) can be prevented from generating particles or causing disconnection of a wiring layer 20 to be described below as a result of the material being pounded out and adhering inside the contact hole 22.

For example, the first silicon oxide film 12 may be etched by RIE with a mixed gas of $CHF_3$ and $O_2$. In this instance the material composing the upper electrode 6 would hardly react with the etching gas. Moreover, when the physical action is made sufficiently weak, the upper electrode 6 is hardly etched, compared to the first silicon oxide film 12. Accordingly, the etching selection ratio of the first silicon oxide film 12 to the upper electrode 6 can be set to, for example, about 10 or greater. On the other hand, the etching selection ratio of the hydrogen barrier film 14 to the upper electrode 6 is, for example, about 1.

Figure 8:
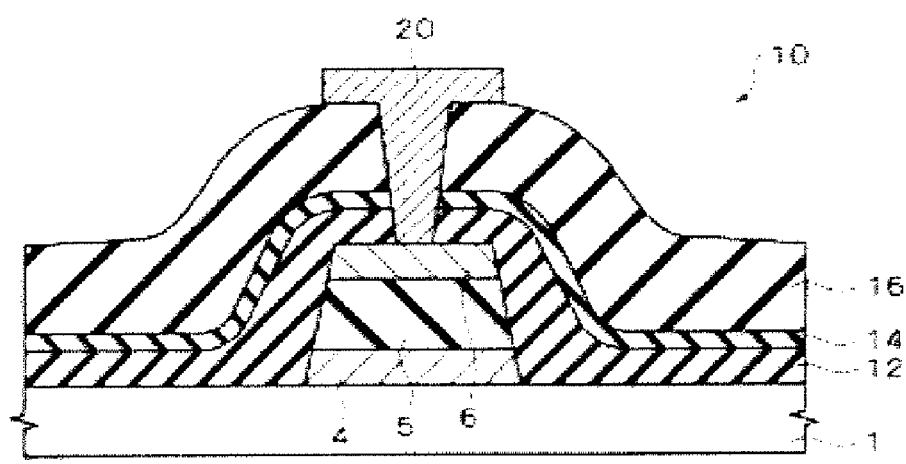
FIG. 8 is a cross-sectional view schematically showing a step of the process for manufacturing a capacitor in accordance with the embodiment of the invention.

Next, as shown in FIG. 8, a wiring layer 20 that embeds the contact hole 22 is formed. The wiring layer 20 may be formed by, for example, a sputter method. As the wiring layer 20, for example, a layer of aluminum can be used.

By the steps described above, a third capacitor in accordance with an embodiment of the invention can be formed, as shown in FIG. 8.

In accordance with the present embodiment, as described above, the columnar section 30 is covered by the first silicon oxide film 12, such that the hydrogen barrier film 14 can be made thinner while securing a desired hydrogen barrier property. By this, the productivity can be improved, and the manufacturing cost can be lowered. In particular, during the process of forming the hydrogen barrier film 14, a film with excellent quality can be formed at a lower film forming rate. Therefore, because the hydrogen barrier film 14 can be made thinner in accordance with the present embodiment, the hydrogen barrier film 14 with excellent quality can be obtained while securing a desired throughput.

Also, in accordance with the present embodiment, the etching selection ratio of the first silicon oxide film 12 to the upper electrode 6 can be made greater than the etching selection ratio of the hydrogen barrier film 14 to the upper electrode 6. By this, as described above, the material composing the upper electrode 6 (such as, for example, Pt or other nonvolatile metal) can be prevented from being pounded out and adhering inside the contact hole 22. Therefore, generation of particles and occurrence of defective wiring inside the contact hole 22 can be prevented. In other words, in accordance with the present embodiment, the contact hole 22 with excellent quality can be formed. Also, because generation of particles can be prevented, the yield can be improved, and the maintenance cycle of the etching apparatus can be made longer.

Also, in accordance with the present embodiment, the total film thickness of the first silicon oxide film 12, the hydrogen barrier film 14 and the second silicon oxide film 16 which cover the columnar section 30 is appropriately determined according to a specific design of the device. In accordance with the present embodiment, because the second silicon oxide film 16 can be formed on the hydrogen barrier film 14, the first silicon oxide film 12 can be made relatively thinner by forming the second silicon oxide film 16 thicker. In other words, when the first silicon oxide film 12 is formed, process damages to the dielectric film 6 can be suppressed to a minimum.

The embodiments of the invention are described above in detail. However, those skilled in the art should readily understand that many modifications can be made without substantially departing from the novel matter and effects of the invention. Accordingly, those modified examples are also included in the scope of the invention.

For example, a capacitor in accordance with the present embodiment can be used as a piezoelectric element by, for example, using a ferroelectric film 5 composed of a piezoelectric material. The piezoelectric element can be applied to, for example, an ink jet recording head that is used in an ink jet printer.

What is claimed is:

1. A method for manufacturing a capacitor, comprising the steps of:
    forming a lower electrode above a base substrate;
    forming a dielectric film composed of one of ferroelectric material and piezoelectric material above the lower electrode;
    forming an upper electrode above the dielectric film;
    forming a first silicon oxide film that covers at least the dielectric film and the upper electrode;
    forming a hydrogen barrier film that covers the first silicon oxide film;
    forming a contact hole penetrating the hydrogen barrier film and the first silicon oxide film; and
    forming a wiring layer that embeds the contact hole, wherein an etching selection ratio of the first silicon oxide film to the upper electrode is greater than an etching selection ratio of the hydrogen barrier film to the upper electrode,
    wherein the first silicon oxide film is formed by a dual-frequency excitation plasma chemical vapor deposition (CVD) method with trimethoxysilane to suppress generation of hydrogen during formation of the first silicon oxide film and prevent deterioration of a hysteresis characteristic of the dielectric film.

2. A method for manufacturing a capacitor according to claim 1, wherein, the hydrogen barrier film is composed of aluminum oxide.

3. A method for manufacturing a capacitor according to claim 1, further comprising the step of etching back the first silicon oxide film before the step of forming the hydrogen barrier film.

4. A method for manufacturing a capacitor according to claim 1, further comprising the step of forming a second silicon oxide film above the hydrogen barrier film.

5. A method for manufacturing a capacitor according to claim 4, wherein a film forming temperature for forming the second silicon oxide film is higher than a film forming temperature for forming the first silicon oxide film.

6. A method for manufacturing a capacitor, comprising the steps of:
    forming a lower electrode above a base substrate;
    forming a dielectric film composed of one of ferroelectric material and piezoelectric material above the lower electrode;
    forming an upper electrode above the dielectric film;
    forming a first silicon oxide film that covers at least the dielectric film and the upper electrode;
    forming a hydrogen barrier film that covers the first silicon oxide film;
    forming a contact hole that penetrates the hydrogen barrier film and the first silicon oxide film by etching the hydrogen barrier film and the first silicon oxide film; and
    forming a wiring layer that embeds the contact hole,
    wherein an etching rate of the hydrogen barrier film is greater than an etching rate of the first silicon oxide film,
    wherein the first silicon oxide film is formed by a dual-frequency excitation plasma chemical vapor deposition (CVD) method.

7. The method of claim 6, wherein the first silicon oxide film is formed with trimethoxysilane.

8. The method of claim 6, wherein the hydrogen barrier film is composed of aluminum oxide.

9. The method claim 6, further comprising the step of etching back the first silicon oxide film before the step of forming the hydrogen barrier film.

10. The method of claim 6, further comprising a step of forming a second silicon oxide film above the hydrogen barrier film.

11. The method of claim 10, wherein a film forming temperature for forming the second silicon oxide film is higher than a film forming temperature for forming the first silicon oxide film.

* * * * *